United States Patent
Cui

(10) Patent No.: US 12,482,793 B2
(45) Date of Patent: Nov. 25, 2025

(54) SPLICED DISPLAY DEVICES

(71) Applicant: Guangzhou China Star Optoelectronics Semiconductor Display Technology Co., Ltd., Guangdong (CN)

(72) Inventor: Zhengbo Cui, Guangzhou (CN)

(73) Assignee: Guangzhou China Star Optoelectronics Semiconductor Display Technology Co., Ltd., Guangzhou (CN)

( * ) Notice: Subject to any disclaimer, the term of this patent is extended or adjusted under 35 U.S.C. 154(b) by 379 days.

(21) Appl. No.: 18/320,982

(22) Filed: May 21, 2023

(65) Prior Publication Data

US 2024/0321835 A1    Sep. 26, 2024

(30) Foreign Application Priority Data

Mar. 21, 2023  (CN) .......................... 202310283477.4

(51) Int. Cl.
  *H01L 25/075* (2006.01)
  *H10H 20/857* (2025.01)

(52) U.S. Cl.
  CPC ....... *H01L 25/0753* (2013.01); *H10H 20/857* (2025.01)

(58) Field of Classification Search
  CPC ... H01L 25/0753; H10H 20/857; F21V 33/00; G02F 1/1333; G02F 1/133603;
  (Continued)

(56) References Cited

U.S. PATENT DOCUMENTS 11,776,987 B2 * 10/2023 Cho ....................... H01L 25/13
                                                    257/79
2012/0251072 A1 10/2012 Cope et al.
(Continued)

FOREIGN PATENT DOCUMENTS

CN      206994729 U    2/2018
CN      212161167 U    12/2020
(Continued)

OTHER PUBLICATIONS

Japanese Office Action issued in corresponding Japanese Patent Application No. 特願2023-196968 dated Nov. 5, 2024, pp. 1-4.
(Continued)

*Primary Examiner* — Victor A Mandala
(74) *Attorney, Agent, or Firm* — Nathan & Associates Patent Agents Ltd.; Menachem Nathan

(57) ABSTRACT

A spliced display device is provided. The spliced display device includes a display panel, a light complement module, and a plurality of driver chips. The display panel includes subpanels spliced with each other, and a splice slit is formed between the subpanels. The light complement module is disposed corresponding to the splice slit and covers the splice slit. The light complement module includes a driver board and a plurality of light-emitting units disposed on the driver board. The driver chips are disposed on the driver board. Each of the light-emitting units is provided with a corresponding one driver chip therein, and is electrically connected with the corresponding one driver chip. A light emitting direction of the light complement module is same with a light emitting direction of the display panel.

17 Claims, 3 Drawing Sheets

(58) Field of Classification Search
CPC ........... G02F 9/35; G02F 9/3026; G09G 3/36; G09G 3/3607; G09G 2300/026; G09G 2300/0452; G09G 2310/0243; G09G 2310/0264; G09G 2320/02; F21Y 2115/10
See application file for complete search history.

(56) References Cited

U.S. PATENT DOCUMENTS

| | | | | |
|---|---|---|---|---|
| 2017/0074474 | A1* | 3/2017 | Bailey | F21V 3/00 |
| 2019/0333901 | A1 | 10/2019 | Cok et al. | |
| 2020/0373280 | A1 | 11/2020 | Kim et al. | |
| 2023/0176411 | A1* | 6/2023 | Fan | G02F 1/133314 349/56 |
| 2023/0375867 | A1* | 11/2023 | Xu | G02F 1/133512 |
| 2024/0006384 | A1* | 1/2024 | Zhao | H10H 20/814 |
| 2024/0019727 | A1* | 1/2024 | Zheng | G02F 1/133388 |
| 2024/0027812 | A1* | 1/2024 | Zhao | H05K 1/189 |
| 2024/0027814 | A1* | 1/2024 | Zhao | G02F 1/13336 |
| 2024/0036374 | A1* | 2/2024 | Xiao | G02F 1/133388 |
| 2024/0038103 | A1* | 2/2024 | Fan | G09F 9/35 |
| 2024/0221604 | A1* | 7/2024 | Hu | G09G 3/32 |
| 2025/0076698 | A1* | 3/2025 | Xiang | H01L 25/0753 |

FOREIGN PATENT DOCUMENTS

| | | | | |
|---|---|---|---|---|
| CN | 112767849 | A | | 5/2021 |
| CN | 113703211 | A | | 11/2021 |
| CN | 114170918 | A | | 3/2022 |
| CN | 114256321 | A | | 3/2022 |
| CN | 114300505 | A | | 4/2022 |
| CN | 114822271 | A | | 7/2022 |
| CN | 114967230 | A | | 8/2022 |
| CN | 115188280 | A | | 10/2022 |
| CN | 115223456 | A | | 10/2022 |
| CN | 111653207 | B | * 12/2022 | ............ G09F 9/301 |
| CN | 218122906 | U | | 12/2022 |
| CN | 116486707 | A | | 7/2023 |
| JP | H11231311 | A | | 8/1999 |
| JP | 2005017614 | A | | 1/2005 |
| JP | 2018522255 | A | | 8/2018 |
| JP | 2021522560 | A | | 8/2021 |
| JP | 2022528002 | A | | 6/2022 |
| KR | 20190027234 | A | | 3/2019 |

OTHER PUBLICATIONS

International Search Report in International application No. PCT/CN2024/073842, mailed on Mar. 25, 2024.
Written Opinion of the International Search Authority in International application No. PCT/CN2024/073842, mailed on Mar. 25, 2024.
Japanese Office Action issued in corresponding Japanese Patent Application No. 特願2023-196968 dated Jun. 4, 2024, pp. 1-3.

* cited by examiner

SPLICED DISPLAY DEVICES

CROSS-REFERENCE TO RELATED APPLICATION

This application claims priority to Chinese Patent Application No. 202310283477.4, filed on Mar. 21, 2023, the disclosure of which is incorporated herein by reference in its entirety.

TECHNICAL FIELD

The present disclosure relates to the field of display technologies, and in particular, to spliced display devices.

BACKGROUND

With the development of preparation technologies of display panels, people put forward higher requirements for display effect and comprehensive performance of the display panels and display devices.

Traditional liquid crystal display (LCD) devices are widely used because of low costs and high resolution, and are especially widely used for outdoor display. With the further improvement of demands, the panels for outdoor display have been gradually developed towards to be large sized, planar, and integrated. Manufacture equipment in relate art cannot meet manufacturing requirements of large-size display panels, so that the required large-size display panel in the relate art is generally formed by splicing multiple panels with different sizes or a same size. However, when the panels are spliced in the relate art, there is a splice slit between adjacent two panels, and an area corresponding to the splice slit cannot be displayed; there is also an area with a certain width at a surrounding border of each panel that cannot be display. In addition, the panels for splicing are relatively independent modules, and the panels are only mechanically spliced with each other, so it is easy to lead to a complex internal structure of the spliced display panel, which is not conducive to later maintenance, thereby reducing comprehensive performance of the spliced display panel.

In summary, when a spliced display panel with a large size is formed by splicing subpanels in the related art, a splice slit will appear between adjacent subpanels, and an area corresponding to the splice slit cannot be displayed; and a structure of the spliced display panel is complex, which is not conducive to further improvement of comprehensive performance of the spliced display panel.

SUMMARY

In view of above, a spliced display device according to embodiments of the present disclosure is provided. The spliced display device includes a display panel, a light complement module, and a plurality of driver chips. The display panel includes subpanels spliced with each other, and a splice slit is defined between the subpanels. The light complement module is disposed corresponding to the splice slit, covers the splice slit, and includes a driver board and a plurality of light-emitting units disposed on the driver board. The driver chips are disposed on the driver board. Each of the light-emitting units is provided with a corresponding one of the driver chips therein and is electrically connected with the corresponding one of the driver chips. Alight emitting direction of the light complement module is same with a light emitting direction of the display panel.

DETAILED DESCRIPTION

Figure 1:
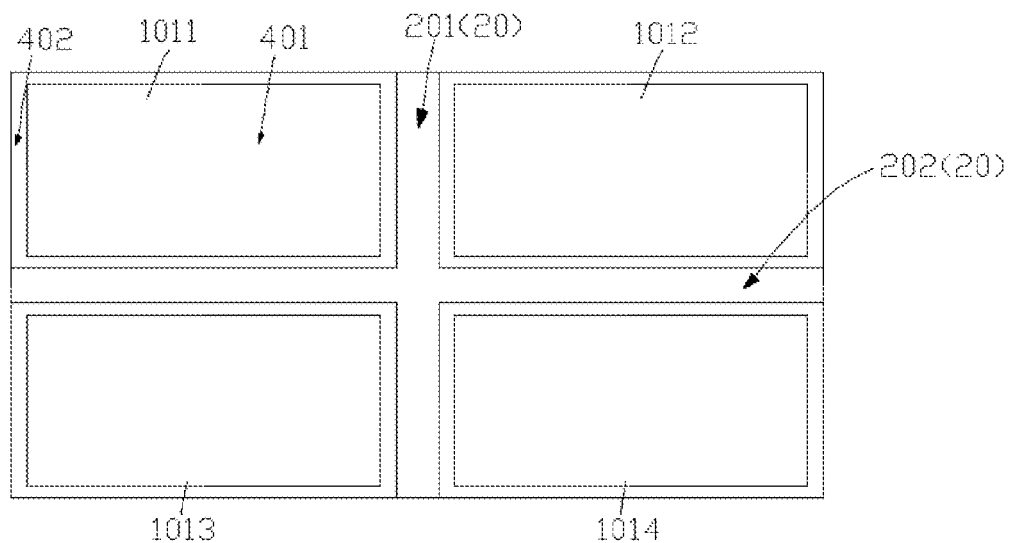
FIG. 1 is a plane structure view of a spliced display device according to an embodiment of the present disclosure.

Some embodiments of the present disclosure will be described below in detail with reference to the accompanying drawings, but not intended to limit the present disclosure.

In the illustration of the present disclosure, it should be understood that orientation and positional relationships indicated by the terms "center", "longitudinal", "transverse", "length", "width", "thickness", "upper", "lower", "front", "back", "left", "right", "vertical", "horizontal", "lateral", "top", "bottom", "inner", "outer", "clockwise", "counter-clockwise", etc. are based on the orientation or positional relationship shown in the drawings, which is only for the convenience of illustrating the present disclosure and simplifying the description, rather than indication or implies that the device or component must have a specific orientation to a specific orientation configuration and operation, and therefore should not be construed as limiting the present disclosure. In addition, the terms, such as "first", "second", "third", "fourth", and so on, are only used for descriptive purposes and cannot be understood as indicating or implying relative importance or implicitly indicating the number of indicated technical features.

With the development of preparation technologies of display panels, people put forward higher requirements for display effect and comprehensive performance of the display panels and display devices.

In the related art, when multiple panels with small size are spliced to form a display panel with a large size, a splice slit will appear between adjacent two panels, and an area corresponding to the splice slit cannot be normally displayed when the spliced display panel are displayed, which reduces display effect and quality of the spliced display panel. At the same time, when the panels are spliced, an internal structure of the spliced display panel is further complicated, which is not conducive to further improvement of comprehensive performance of a display device.

Embodiments of the present disclosure provides a spliced display device capable of effectively improving a splicing effect and effectively simplifying an internal structure thereof, thereby improving the comprehensive performance thereof.

As shown in FIG. 1, it is a plane structure view of a spliced display device according to an embodiment of the present disclosure. Specifically, the spliced display device includes a display panel formed by splicing a plurality of different subpanels. Each of the subpanels has a small size. When the different subpanels ae spliced, the display panel having a large size is formed. Herein, a number of the subpanels can be changed according to a required size of the spliced display panel. In the following embodiments, four different subpanels are spliced as an example, and other splicing number of the subpanels will not be repeated here.

Optionally, there are four subpanels for splicing. Specifically, the display panel includes a first subpanel 1011, a second subpanel 1012, a third subpanel 1013, and a fourth subpanel 1014. When the above different subpanels are spliced, the subpanels are spliced by sides to sides. In the embodiment of the present disclosure, the above different subpanels may have same specifications, and each of the subpanels can emit light independently, so that luminous effect of each subpanel can be adjusted separately to achieve different display effects, or the subpanels may be adjusted to have a same luminous effect, that is, when adjusting, each subpanel changes the same, at this time, the above four subpanels can be regarded as a whole, thereby simplifying a control process and ensuring consistency of luminous effect of the subpanels, which will not be repeated here.

In the embodiment of the present disclosure, when splicing, the first subpanel 1011 and the second subpanel 1012 are arranged side by side in a first row, and the third subpanel 1013 and the fourth subpanel 1014 are arranged side by side in a second row. In this way, the first subpanel 1011, the second subpanel 1012, the third subpanel 1013, and the fourth subpanel 1014 are spliced to form a rectangular structure. A splice slit 20 is formed between the subpanels.

In the following embodiments, the splice slit 20 is illustrate by taking that the splice slit 20 includes a first splice slit 201 and a second splice slit 202 as an example. Herein, the first splice slit 201 corresponds to a width direction of the display panel, and the second splice slit 202 corresponds to a length direction of the display panel. Therefore, a length of the first splice slit 201 is less than a length of the second splice slit 202, and a width of the first splice slit 201 may be designed same with a width of the second splice slit 202.

In the embodiment of the present disclosure, when splicing the above four different subpanels, a fixed frame corresponding to an outer edge of the display panel may be provided, and the subpanels may be each correspondingly placed on the fixed frame, so as to achieve splicing. Specifically, the fixed frame may be disposed on a back side of the display panel, which is not specifically shown in the figures.

Figure 2:
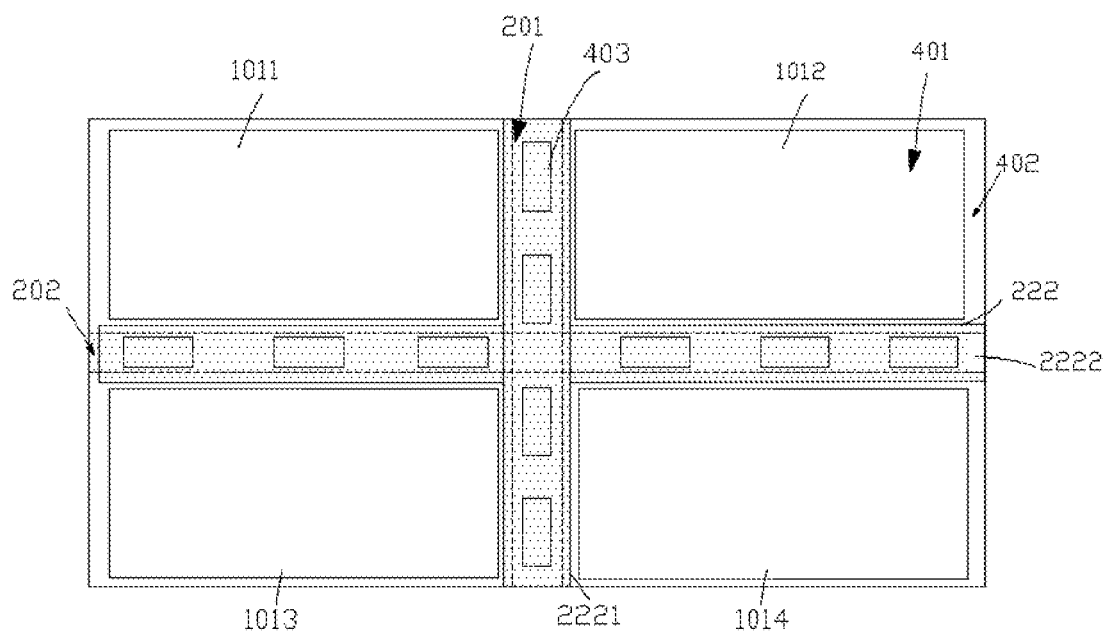
FIG. 2 is a schematic view showing a splicing effect of a spliced display device according to an embodiment of the present disclosure.

Furthermore, as shown in FIG. 2, it is a schematic view showing a splicing effect of a spliced display device according to an embodiment of the present disclosure. Combined with the view in FIG. 1, in the embodiment of the present disclosure, each subpanel includes a display area 401 and a border area 402 disposed on at least one side of the display area 401. Specifically, the border area 402 may be disposed around the display area 401, and the border area 402 corresponds to all around periphery of the corresponding subpanel. The border area 402 cannot be displayed. In the spliced display panel, the border areas 402 of spliced subpanels are superimposed on the splice slit between the border areas 402, which will further expand the non-display area of the entire display panel, thereby reducing the display effect of the display panel.

The spliced display device further includes a light complement module 222. Specifically, the light complement module 222 is disposed corresponding to the splice slit 20.

For example, the light complement module 222 includes a first light complement module 2221 and a second light complement module 2222. Herein, the first light complement module 2221 is disposed corresponding to the first splice slit 201, and the second light complement module 2222 is disposed corresponding to the second splice slit 202. When the above light complement modules are arranged, the light complement modules each completely covers a corresponding one of the splice slits, and a light emitting direction of the light complement module is same with a direction of the light emitted from a light emitting side of each subpanel. In this way, when the light complement module 222 and the subpanels work normally, there will also be light emitted from the area corresponding to the splice slits, so as to ensure that a light intensity of the area corresponding to the splice slits is same with a light intensity of the display area of the display panel, and then ensure display effect of the display panel.

Furthermore, the light complement module further includes a plurality of light-emitting units 403. Each of the light-emitting units 403 can emit light to achieve a function of light complement of the light complement module 222 and to relieve display problems of the splice slits.

Specifically, the light complement module 222 may be arranged as a light-emitting light board, for example, the light-emitting light board may be an LED light board or a Micro-LED light board. A plurality of light-emitting units 403 are provided on the light board, and each of the light-emitting units corresponds to an LED bead. In the embodiment of the present disclosure, the light-emitting units 403 may be arranged on a driver board of the light complement module 222. In the following embodiments, the light complement module 222 is illustrated with an example of the LED light board, and a plurality of LED beads are provided on the LED light board, thereby realizing effect of light complement of the light board.

In the embodiment of the present disclosure, the plurality of light-emitting units 403 may be arranged in one or more rows on the light board, so as to adjust the light in the area corresponding to the splice slits according to different conditions of light complement.

Referring to FIG. 2 for details, when the light complement module 222 are arranged, two opposite sides of the light complement module 222 are attached to the border areas of corresponding subpanels. For example, a left side of the first light complement module 2221 is simultaneously attached to the border areas 402 of the first subpanel 1011 and the third subpanel 1013 and does not overlap with the display areas 401, and the left side of the first light complement module 2221 is flush with a boundary of the display area 401 of the first subpanel 1011; at the same time, a right side of the first light complement module 2221 is simultaneously attached to the border areas 402 of the second subpanel 1012 and the fourth subpanel 1014 and does not overlap with the display areas 401, and the right side of the first light complement module 2221 is flush with a boundary of the display area 401 of the second subpanel 1012. Therefore, installation and fixation of the first light complement module 2221 are realized, and similarly, the second light complement module 2222 is attached and fixed in a same way. In the embodiment of the present disclosure, when the above light complement module 222 is working, the border area 402 of each subpanel and the area corresponding to the splice slit 401 between adjacent subpanels can be simultaneously compensated for light, thereby achieving luminous effect consistent with the display area of the display panel.

In the embodiment of the present disclosure, when the light complement module 222 is fixed in accordance with the above method, a height of the light complement module 222 should be limited. Specifically, the height of the light complement module 222 is less than or equal to 10 mm. Optionally, the height of the light complement module 222 may be 1 mm or 3 mm, so as to effectively reduce a height difference between the light complement module 222 and a top surface of the subpanel, thereby ensuring display effect.

Figure 6:
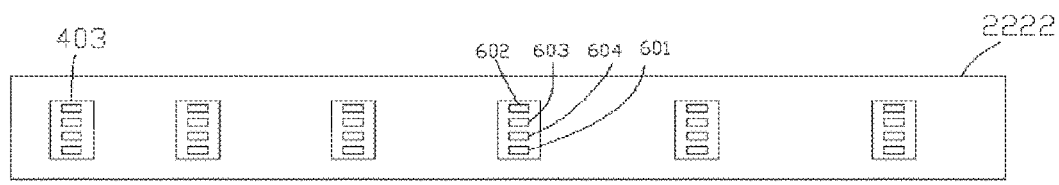
FIG. 6 is a schematic structural view of a second light complement module according to an embodiment of the present disclosure.

As shown in FIG. 6, it is a schematic structural view of a second light complement module according to an embodiment of the present disclosure. In the embodiment of the present disclosure, when each of the light-emitting units 403 is arranged, the light-emitting unit 403 includes a plurality of subpixels with different colors. In the following embodiments, the light-emitting units 403 may be equally spaced on the second light complement module 2222. At the same time, each of the light-emitting units 403 includes a driver chip 601, and in the embodiment of the present disclosure, the driver chip 601 may be disposed on the driver board together with the light-emitting unit 403. The driver board is mainly a carrier board, and traces may be arranged on the driver board to connect the driver chip 601 and a terminal of the corresponding light-emitting unit 403. At the same time, each of the light-emitting units 403 is also provided with a blue subpixel 602, a green subpixel 603, and a red subpixel 604.

Specifically, when the above structure is arranged, the driver chip 601, the blue subpixel 602, the green subpixel 603, and the red subpixel 604 may be arranged side by side in the light-emitting unit 403, such as a vertical or horizontal arrangement, or the above subpixels and the driver chip 601 are arranged in a multi-row or multi-column structure according to a size of the light-emitting unit 403. When arranging, the above subpixels with different color can be reasonably arranged according to the needs of different products, which will not be repeated here.

In the embodiment of the present disclosure, the driver chip 601 is correspondingly and electrically connected with the blue subpixel 602, the green subpixel 603, and the red subpixel 604, and is packaged in a same light-emitting unit 403 together with the blue subpixel 602, the green subpixel 603, and the red subpixel 604. When each of the subpanels is displayed normally, each light-emitting unit 403 of the second light complement module 2222 emits light, and the luminous effect of each light-emitting unit 403 can be adjusted by the driver chip 601, so as to effectively improve display effect of the display area and the area corresponding to the splice slit, thereby ensuring consistency of luminous effect.

Figure 3:
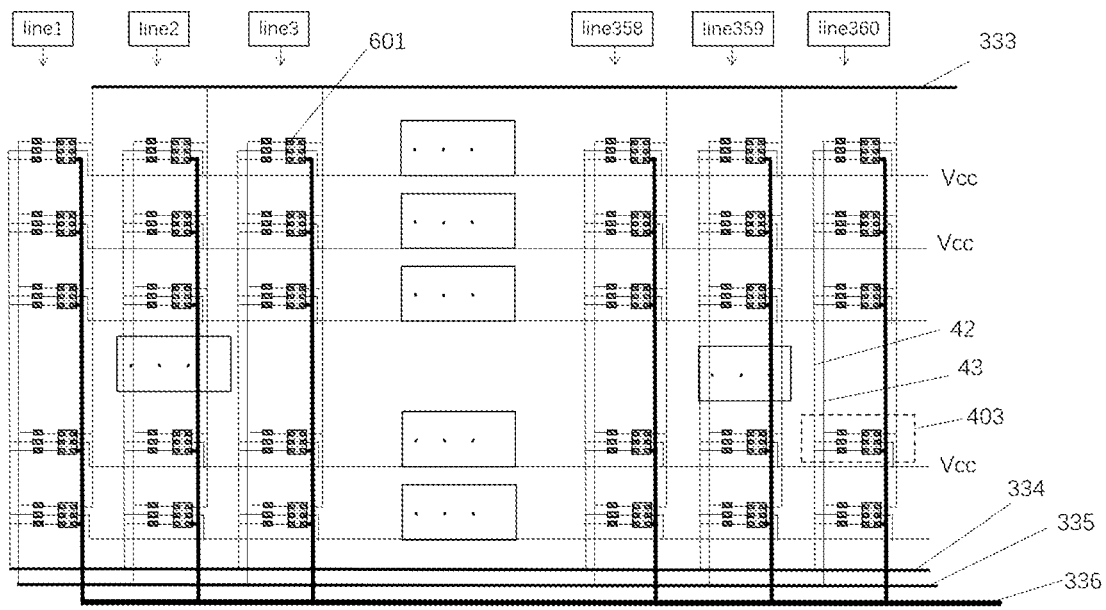
FIG. 3 is a schematic view of a circuit structure of light-emitting units on a second light complement module according to an embodiment of the present disclosure.

As shown in FIG. 3, it is a schematic view of a circuit structure of light-emitting units on a second light complement module according to an embodiment of the present disclosure. Combined with the structures in FIG. 1 to FIG. 3, in the embodiment of the present disclosure, since each of the light-emitting units 403 is provided with a corresponding driver chip 601 integrated therein, a number of the traces and a number of connectors in the light complement module can be further reduced, thereby simplifying the structure.

Specifically, the plurality of light-emitting units 403 of the second light complement module 2222 can be arranged in a rectangular array with m*n. Optionally, m is a corresponding number of rows, a value of m may be between 1-50; and n is a corresponding number of columns (referring to line1, line2, etc., shown in the figures), a value of n may be between 50-512. In the following embodiments, that m=6 and n=360 is taken as an example. Other numbers of rows or columns may be referred to in the manner of the present disclosure.

In the embodiment of the present disclosure, the light-emitting units 403 in adjacent two rows may be spaced a same interval distance apart, and the light-emitting units 403 in adjacent two columns may also be spaced a same interval distance apart. Each of the light-emitting units 403 is provided with a corresponding signal line, so that the light-emitting unit 403 can be controlled.

Specifically, the spliced display device includes power supply voltage lines Vcc, a first voltage signal line 333, a second voltage signal line 334, a third voltage signal line 335, and a GND signal line 336. Herein, each row of the light-emitting units 403 correspond to one of the power supply voltage lines Vcc, for example, each of the power supply voltage lines Vcc is arranged at a position between two rows of the light-emitting units 403 and extends to an edge of the light complement module 222, and the power supply voltage line Vcc is electrically connected with the light-emitting units 403 in the corresponding row to supply power.

At the same time, the first voltage signal line 333 is disposed at a top edge of the light complement module, such as arranged at an upper position adjacent to the edge of the second light complement module 2222. After arranged, a plurality of first lines are led from the first voltage signal line 333 at positions corresponding to each column of the light-emitting units 403, and each of the first lines is electrically connected with the corresponding column of the light-emitting units 403.

Furthermore, the second voltage signal line 334, the third voltage signal line 335, and the GND signal line 336 are successively arranged at a lower position adjacent to an edge of the second light complement module 2222. Specifically, the second voltage signal line 334 and the third voltage signal line 335 may be arranged above the GND signal line 336, so as to ensure that the GND signal line 336 better implements a grounding function and ensure a normal operation of the light complement module.

In the embodiment of the present disclosure, a plurality of second lines 42 are led from the second voltage signal line 334 at positions corresponding to each column of the light-emitting units 403, and a plurality of third lines 43 are led from the third voltage signal line 335 at positions corresponding to each column of the light-emitting units 403. Herein, each of the second lines 42 and third lines 43 is electrically connected with the corresponding column of the light-emitting units 403.

Specifically, because each light-emitting unit 403 is provided with the driver chip 601, the blue subpixel 602, the green subpixel 60, and the red subpixel 604 therein, in the embodiment of the present disclosure, different voltage signal lines can be provided to achieve different control functions. In an embodiment, referring to a connection method shown in FIG. 3 for detail, the second voltage signal line 334 is electrically connected with the blue subpixels 602 and the green subpixels 603 in each column of the light-emitting units 403 through the second lines 42, so as to simultaneously provide a control signal to the blue subpixels 602 and the green subpixels 603 through the second voltage signal line 334; and the third voltage signal line 335 is electrically connected with the red subpixels 604 in each column of the light-emitting units 403 through the third lines 43, so as to simultaneously provide a control signal to the red subpixels 604 through the third voltage signal line 335.

In the embodiment of the present disclosure, different light-emitting units 403 are connected in series or parallel by the second voltage signal line 334 and the third voltage signal line 335, so as to realize control of different subpixels in the light-emitting units 403. A plurality of subpixels with different colors can be simultaneously controlled a same voltage signal line, which can effectively simplify the light complement module, reduce traces in the display device, and effectively improve control efficiency. At the same time, each light-emitting unit 403 is electrically connected with the corresponding driver chip 601, so that independent control is realized, which can further simplify the light complement module and further reduce traces in the display device.

When each subpanel is displayed normally, different control signals are provided by the power supply voltage lines Vcc, the first voltage signal line 333, the second voltage signal line 334, the third voltage signal line 335, and the GND signal line 336, so as to ensure normal illumination of the light complement module 222 while the subpanels emit light, thereby improving display effect of the area corresponding to the splice slit.

In the embodiment of the present disclosure, when the above voltage signal lines are arranged, voltage values provided by a same signal line to the light-emitting units 403 in spacer columns may be the same. The light-emitting units 403 in a first column (referring to line1 shown in figures) of a third column (referring to line3 shown in figures) are taken as an example, each of the first voltage signal line 333, the second voltage signal line 334, and the third voltage signal line 335 provides a same voltage on the light-emitting units 403 in the first and third columns, so that the light-emitting units 403 in the first and third columns are ensured to have a same luminous effect. At the same time, each of the light-emitting units 403 in the second and fourth columns may have a voltage same with or different from the corresponding voltage of each of the light-emitting units 403 in the first and third columns provided by a same signal line, so as to realize adjustment of different light-emitting units 403. In this way, the light-emitting units 403 in adjacent columns are provided with different control modes, so as to realize diversified control effect of the light complement module, ensure display effect of the area corresponding to the splice slit, and improve the user's use and experience.

When the spliced display panel is displayed normally, the display panel has a first control sequence, and the liquid crystals in the panel is scanned under the first control sequence to display normally. In the embodiment of the present disclosure, because each of the light-emitting units 403 is provided with the driver chip 601 therein, the first voltage signal line 333 may provide a second control sequence to the driver chip 601, and the subpixels are controlled under the second control sequence to emit light. The first control sequence and the second control sequence may be same, so as to ensure that the display effect of the display area of each subpanel is the same as the luminous effect of the light complement module corresponding to the splice slit, thereby improving the comprehensive performance of the display panel.

Figure 4:
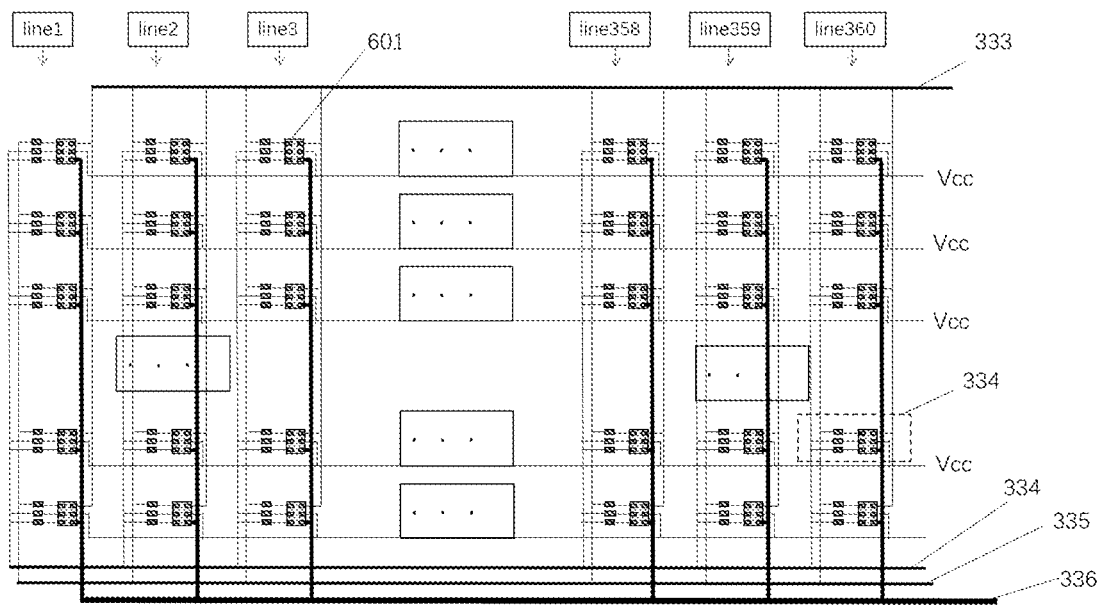
FIG. 4 is a schematic view of another circuit structure of light-emitting units on a second light complement module according to an embodiment of the present disclosure.

As shown in FIG. 4, it is a schematic view of another circuit structure of light-emitting units on a second light complement module according to an embodiment of the present disclosure. Combined with the structure shown in FIG. 3, in the embodiment of the present disclosure, the first voltage signal line 333 and the third voltage signal line 335 are both electrically connected with each column of the light-emitting units through corresponding lines. Specifically, the first voltage signal line 333 is simultaneously and electrically connected with the driver chips 601 and the red subpixels 604, and the second voltage signal line 334 is electrically connected with the blue subpixel 602 and the green subpixel 603, so that the red subpixel and the driver chip 401 are controlled by a same signal, and the blue subpixel 602 and the green subpixel 603 are controlled by a same signal. When the light complement module emits light normally, different control of the subpixels with different colors can be realized, thereby achieving different luminous effects.

In the embodiment of the present disclosure, the driver chip 601 is provided in each light-emitting unit 403, and the driver chip 601 can be connected with the subpixel with different colors, thereby achieving different control effects. At the same time, through the above structure, the traces in the display panel can be further reduced, and the traces can be integrated on a back side of the light complement module, so as to simplify the structure of the display panel. Furthermore, in order to improve consistency of display effect of the light complement module and display effect of the display area, at least a part of the driver chips 601 each have a control sequence same with the control sequence of the display panel, thereby improving overall display effect of the display panel.

Figure 5:
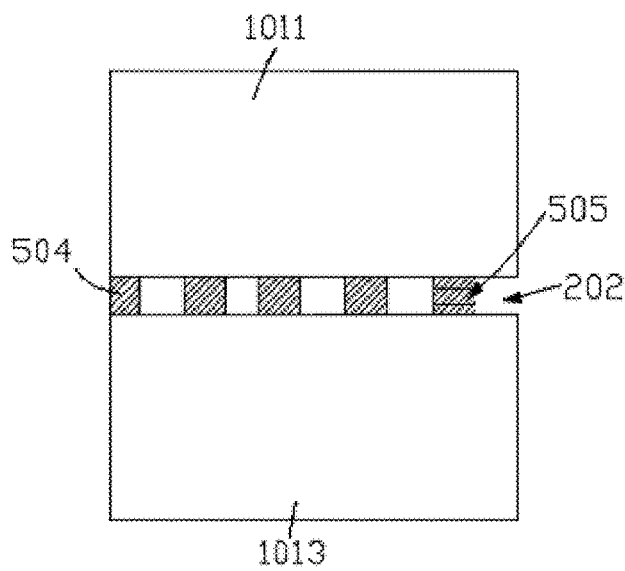
FIG. 5 is a schematic view of a spliced structure according to an embodiment of the present disclosure.

As shown in FIG. 5, it is a schematic view of a spliced structure according to an embodiment of the present disclosure. Combined with the structures shown in FIG. 1 to FIG. 3, in the embodiment of the present disclosure, when different light complement modules are disposed corresponding to the splice slits, such as the second light complement module 2222 is disposed in the second splice slit 202, a plurality of support block 504 are further provided in the second splice slit 202 at intervals to support the light complement module, such as at equal intervals. The support blocks 504 are arranged as spaced parts to reduce a total weight thereof, thereby realizing the thin and light setting of the spliced display panel.

Furthermore, in order to ensure the splicing effect, in the embodiment of the present disclosure, when the plurality of support blocks 504 are arranged, a clasp groove 505 is defined on a surface of each support block 504 facing a light-emitting side. When the support blocks 504 are clamped in the splice slit, the corresponding light complement module is clamped in each clasp groove 505, so as to fix the light complement module and complete the splicing of the entire spliced structure.

In the embodiment of the present disclosure, an arrangement density of the support block 504 in the first splice slit 201 and an arrangement density of the support block 504 in the second splice slit 202 may be same, thereby ensuring consistency of different areas of the spliced display device. Furthermore, when different light complement modules are arranged, such as the first light complement module 2221 and the second light complement module 2222, within a unit length, a number of the light-emitting units 403 on the first light complement module 2221 is same with a number of the light-emitting units 403 on the second light complement module 2222. In this way, when different light complement modules work at the same time, they have a consistent display effect, thereby ensuring that the overall display effect of the spliced display device is consistent.

Figure 7:
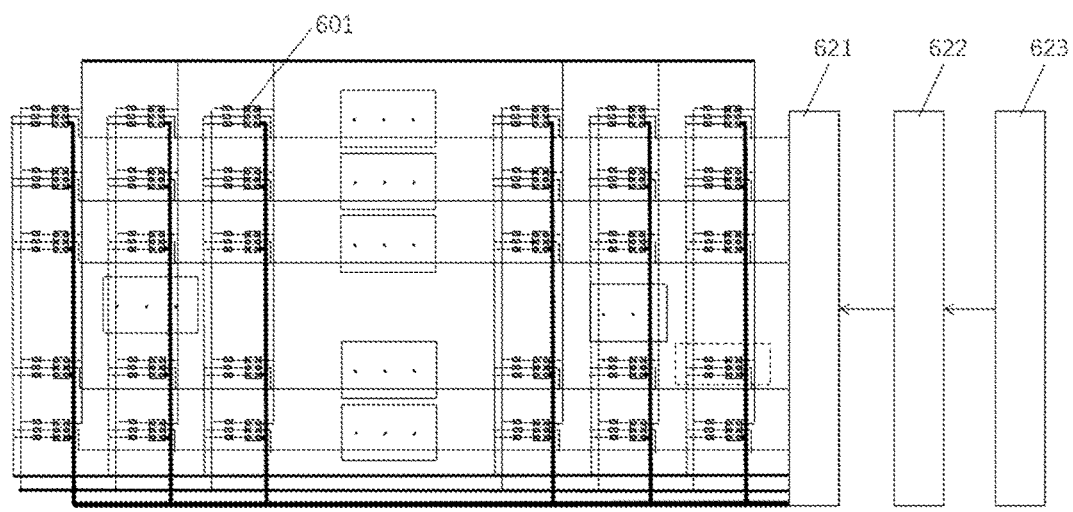
FIG. 7 is a schematic structural view of another light complement module according to an embodiment of the present disclosure.

As shown in FIG. 7, it is a schematic structural view of another light complement module according to an embodiment of the present disclosure. Combined with the structures shown in FIG. 1 to FIG. 4, in the embodiment of the present disclosure, the spliced display device further includes one or more connectors 621, one or more receivers 622, and a transmitter 623.

Specifically, the above connectors 621 may be disposed on the back side of the light complement module 222, and the receivers 622 and the transmitter 623 may also be disposed on the back side of the light complement module 222, or disposed at other positions of the display panel. The connectors 621 are electrically connected with the light complement module 222. Specifically, each of the connectors 621 is electrically connected with a corresponding one of the power supply voltage lines Vcc to provide the control signal to the light-emitting units 403. In the embodiment of the present disclosure, connection ports of the connector 621 may be arranged as an integrated port, and when electrically connected, the connection ports of the connector 621 are correspondingly connected with the terminals of the light-emitting units on the light complement module, so as to effectively reduce the traces of the display panel and simplify the structure of the spliced display panel.

The receivers 622 are electrically connected with the connectors 621, and the transmitter 623 is electrically connected with the receivers 622. Herein, the transmitters 623 provide control signals to the receivers 622, each transmitter 623 may be simultaneously and electrically connected with multiple receivers 622, and each receiver 622 may be electrically connected with multiple connectors 621 and control the driver chips 601 in the light-emitting units 403, so that the light complement module can emit light normally, and the luminous effect is regulated to ensure that the spliced display device has good consistency, thereby effectively simplifying the spliced structure of the spliced display device and improving comprehensive performance.

Furthermore, in the embodiment of the present disclosure, the spliced display device may be applied to computers, electronic paper, monitors, laptops, digital photo frames, and other products or components which can display or have spliced or folding function, and the specific type thereof is not specifically restricted.

The spliced display devices according to some embodiments of the present disclosure have been described above in detail. Those skilled in the art can make various changes and modifications without departing from the spirit of the present disclosure. Therefore, the described embodiments are not intended to limit the present disclosure.

What is claimed is:

1. A spliced display device, comprising:
a display panel, comprising subpanels spliced with each other, and a splice slit being defined between the subpanels;
a light complement module, disposed corresponding to the splice slit, covering the splice slit, and comprising a driver board and a plurality of light-emitting units disposed on the driver board; and
a plurality of driver chips, disposed on the driver board;
wherein each of the light-emitting units is provided with a corresponding one of the driver chips therein, and is electrically connected with the corresponding one of the driver chips, and a light emitting direction of the light complement module is same with a light emitting direction of the display panel.

2. The spliced display device according to claim 1, wherein the light-emitting units are arranged in an array along the splice slit, each of the light-emitting units further comprises a blue subpixel, a red subpixel, and a green subpixel; and
wherein the blue subpixel, the red subpixel, and the green subpixel are electrically connected with the corresponding one of the driver chips.

3. The spliced display device according to claim 2, wherein the blue subpixel, the red subpixel, the green subpixel, and the corresponding one of the driver chips are arranged side by side in a corresponding one of the light-emitting units.

4. The spliced display device according to claim 3, wherein the blue subpixel, the red subpixel, the green subpixel, and the corresponding one of the driver chips are arranged in a row or in a column.

5. The spliced display device according to claim 2, further comprising a first voltage signal line, a second voltage signal line, and a third voltage signal line,
wherein the first voltage signal line is electrically connected with the driver chips, the second voltage signal line is electrically connected with the blue subpixel and the green subpixel of each of the light-emitting units, and the third voltage signal line is electrically connected with the red subpixel of each of the light-emitting units.

6. The spliced display device according to claim 5, wherein voltage values provided by a same one of the first voltage signal line, the second voltage signal line, and the third voltage signal line to the light-emitting units in spacer columns are same.

7. The spliced display device according to claim 2, further comprising a first voltage signal line and a second voltage signal line,
wherein the first voltage signal line is electrically connected with the driver chips and the red subpixel of each of the light-emitting units, and the second voltage signal line is electrically connected with the blue subpixel and the green subpixel of each of the light-emitting units.

8. The spliced display device according to claim 2, further comprising a plurality of power supply voltage lines,
wherein each of the power supply voltage lines is arranged between two rows of the light-emitting units and extends to an edge of the light complement module; and each of the power supply voltage lines is electrically connected with a corresponding row of the light-emitting units to supply power.

9. The spliced display device according to claim 1, wherein at least a part of the driver chips each have a control sequence same with a control sequence of the display panel.

10. The spliced display device according to claim 1, wherein the display panel comprises a first subpanel, a second subpanel, a third subpanel, and a fourth subpanel spliced to form a rectangular structure;
the splice slit comprises a first splice slit and a second splice slit between the first subpanel, the second subpanel, the third subpanel, and the fourth subpanel;
the light complement module comprises a first light complement module disposed corresponding to the first splice slit and a second light complement module disposed corresponding to the second splice slit;
a width of the first splice slit is same with a width of the second splice slit; and
within a unit length, a number of the light-emitting units in the first light complement module is same with a number of the light-emitting units in the second light complement module.

11. The spliced display device according to claim 1, wherein each of the subpanels comprises a display area and a border area disposed on at least one side of the display area; and
two opposite sides of the light complement module are both correspondingly attached to border areas of the subpanels and are flush with boundaries of display areas of the subpanels.

12. The spliced display device according to claim 11, wherein a plurality of support blocks are further provided in the splice slit at intervals, each of the support blocks is provided with a clasp groove at a middle portion, and the light complement module is correspondingly fixed in the clasp groove.

13. The spliced display device according to claim 1, further comprising one or more connectors, wherein each of the connectors is electrically connected with the display panel and the light complement module, and is configured to provide control signals to the display panel and the light complement module.

14. The spliced display device according to claim 13, wherein the connectors are disposed on a back side of the light complement module.

15. The spliced display device according to claim 13, wherein connection ports of each of the connectors are arranged as an integrated port, and the connection ports of the connectors are correspondingly connected with terminals of the light-emitting units on the light complement module.

16. The spliced display device according to claim 13, further comprising a transmitter and a plurality of receivers, wherein the transmitter is electrically connected with multiple ones of the receivers, and each of the receivers is electrically connected with multiple ones of connectors.

17. The spliced display device according to claim 1, further comprising a transmitter and a plurality of receivers, wherein the transmitter is electrically connected with multiple ones of the receivers, and each of the receivers is electrically connected with corresponding ones of the driver chips on the light complement module.

* * * * *